United States Patent
Arz et al.

(10) Patent No.: US 6,515,479 B1
(45) Date of Patent: *Feb. 4, 2003

(54) SWITCHABLE LONGITUDINAL GRADIENT COIL

(75) Inventors: Winfried Arz, Erlangen (DE); Matthias Gebhardt, Erlangen (DE); Franz Schmitt, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 09/524,616

(22) Filed: Mar. 14, 2000

(30) Foreign Application Priority Data

Mar. 23, 1999 (DE) .......................... 199 13 124

(51) Int. Cl.⁷ ................................. G01V 3/00
(52) U.S. Cl. ........................ 324/318; 324/322
(58) Field of Search ...................... 324/318, 322, 324/300, 309, 310, 311, 312, 313, 314, 319, 320, 321; 335/299

(56) References Cited

U.S. PATENT DOCUMENTS

| 5,311,135 A | * | 5/1994 | Vavrek et al. | 324/318 |
| 5,334,937 A | * | 8/1994 | Peck et al. | 324/318 |
| 5,349,318 A | | 9/1994 | Inoue | 335/299 |
| 5,736,858 A | | 4/1998 | Katmnelson et al. | 324/318 |
| 6,297,635 B1 | * | 10/2001 | Arz et al. | 324/318 |

FOREIGN PATENT DOCUMENTS

GB  2 331 808  6/1999

* cited by examiner

Primary Examiner—Edward Lefkowitz
Assistant Examiner—Tiffany A. Fetzner
(74) Attorney, Agent, or Firm—Schiff Hardin & Waite

(57) ABSTRACT

A switchable longitudinal gradient coil with a cylindrical structure and windings that are symmetrically arranged around the Z-axis is composed of discrete windings or winding packets, or of continuous windings or continuous winding packets, which are provided with a separate supply line to an end face and which, outside of the coil, can be selectively connected to one another individually and/or in groups corresponding to the desired performance features.

6 Claims, 5 Drawing Sheets

SWITCHABLE LONGITUDINAL GRADIENT COIL

BACKGROUND OF THE INVENTION

1. Field of the Invention

The present invention is directed to a switchable longitudinal gradient coil of the type having a cylindrical structure and windings that are symmetrically arranged around the longitudinal axis.

2. Description of the Prior Art

The required efficiency of a gradient coil is essentially dependent on the type of the MR-imaging. Conventional MR-imaging normally requires a good linearity volume (~5% in the linearity volume of 40–50 cm) given moderate gradient intensities (10–20 mT/m) and switching times (~1 ms). High gradients (20–40 mT/m) are extremely rapidly switched (100–500 µs) for the fast MR-imaging. Side effects in the form of peripheral muscle stimulations in the patient disposed in the field can arise as a result. Generally, the linearity volume of the gradient coils is reduced in order to avoid these effects; this leads to a reduction of the maximal field boosts and therefore also reduces the stimulation risk. The maximal field boost, in addition to other factors, determines the stimulation risk. Therefore, the linearity volume can become reduced from typically 40–50 cm to 20 cm DSV given fast gradient coils. A coil with such properties is normally not appropriate for conventional whole body applications, but is appropriate for fast MR-imaging, such as EPI, RARE, HASTE, GRASE etc. The speed is the essential advantage in such sequences.

Another reason for different field qualities is that the linearity normally diminishes with the distance from the center when a gradient coil is designed for a specific volume. The human body does not necessarily follow this. For example, the shoulders are situated in this area. Given imaging of the spine, it is often expedient to image the entire spine without rearrangement of the patient. Depending on the center positioning, the cervical and/or lumbar vertebras also lie in the area of the larger non-linearities. Image distortions cannot be avoided as a result. Given head gradient coils, the homogeneity volume is smaller due to the smaller diameter of the coil. This only allows imaging parts of the brain but does not allow the imaging of the cervical spine. Therefore, it can be desirable for the radiologist to change from a central FOV to a displaced or shifted FOV, but this has hitherto not been possible. There are only coils of the one type or the other type.

Due to the above reasons, the customer (apparatus purchaser) therefore has to decide whether he wants to have a field quality A, B or C. However, it would be desirable to have a number of coil properties (field qualities) united in one coil and to be able to activate these depending on the application. A basic problem is the accommodation of the multiple coils in the coil body without significantly increasing the volume (resulting in the coils becoming more expensive) and compromising the sub-coil properties that are partially competing. "Longitudinal" gradient coils are known in the field of magnetic resonance imaging and are gradient coils that provide a gradient field in the direction of the basic magnetic field, namely in the direction of the cylinder axis, given cylindrical magnets. Since this direction is also referred to as the "z-direction" in the MR-technique, the longitudinal gradient coils are also referred to as "Z-gradient coils" in the following.

German OS 195 40 746 describes a modular gradient system in which a conventional and a fast gradient coil system are united in a coil body. The conventional gradient coil system exhibits a large linearity volume but can be switched only slowly and also allows only average gradient amplitudes. In contrast thereto, the fast gradient system has a smaller linearity volume but allows the faster switching of extremely high gradient amplitudes.

Whereas a series of possibilities have already been proposed for the transversal coils, which are usually four in number and are referred to as saddle coils, in order to generate a gradient field that is designed according to the required performance features, conventional Z-gradient coils do not allow this. These Z-gradient coils or longitudinal coils are normally composed of a number of solenoid sub-coils that are symmetrically disposed around the Z=0 position. Both halves Z>0 and Z<0 are switched such that the halves are operated with respectively opposite current directions, so that a linear gradient field arises in total.

SUMMARY OF THE INVENTION

An object of the present invention is to provide a switchable Z-gradient coil that allows a versatile changing of the magnetic field generated with the coil, which achieves a better adaptation to the required imaging conditions without physically re-orienting the coil.

This object is inventively achieved in a Z-gradient coil composed of discrete windings or winding packets or of continuous windings or continuous winding packets, which are provided with separate supply lines to an end face and which, outside of the coil, can be individually connected to one another and/or can be connected to one another in groups, depending on the desired performance features.

In the extreme case, an inventive switchable Z-coil is composed solely of open single windings, whose respective winding ends are separately led outside by means of supply lines, so that the single windings can be arbitrarily connected with one another to different sub-groups that enable respectively different performance features. The selectable performance features are the linearity, the linearity volume, the shielding, the inductivity, the noise (participation factors), the stimulation sensitivity, the maximum gradient intensity and the maximum slew rate.

The ability to reverse the current direction is also one of the different optional connecting possibilities of the individual windings and winding packets. Among other things, this enables a connectable Lorentz force compensation.

The circuit arrangement for the connecting of the windings and winding packets with one another, as desired, so as to correspond to the desired performance features; can be designed such that the performance features are statically fixed and connected before a sequence operation or such that the performance features are dynamically switchable during a sequence operation.

The individual windings can exhibit different diameters, with the windings and winding groups of the respectively radial planes being connectable to units, such as primary coils and secondary coils.

DESCRIPTION OF THE DRAWINGS

FIG. 10 is a perspective view of an inventive switchable Z-coil having two inner units and one outer unit in a further embodiment.

DESCRIPTION OF THE PREFERRED EMBODIMENTS

Figure 1:
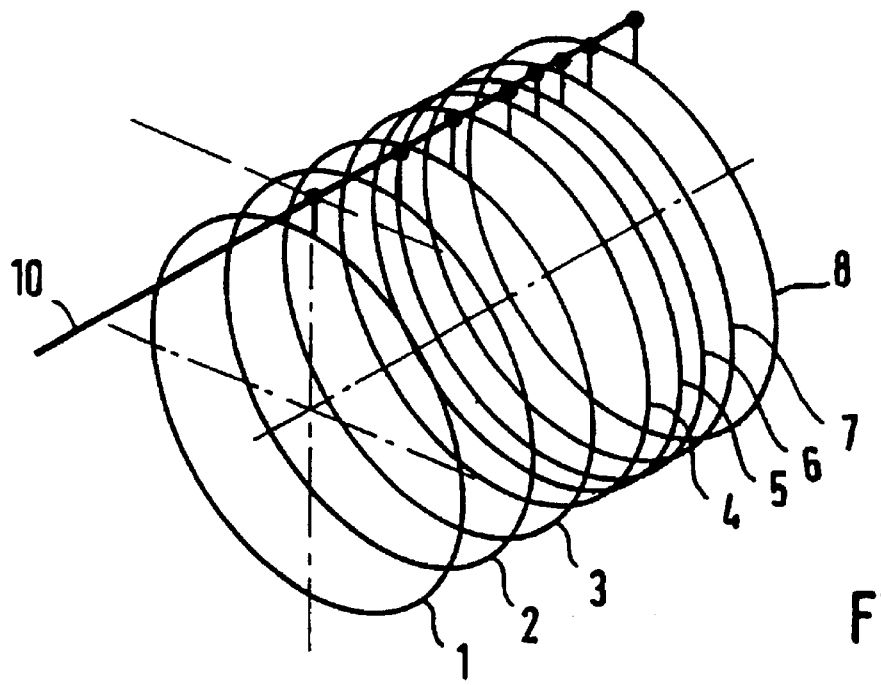
FIG. 1 schematically illustrates one-half of an inventive switchable Z-gradient coil, with the connectability being schematically indicated for the individual windings or winding packets.

The Z-gradient coil, which is schematically shown in FIG. 1, is formed by eight individual windings 1 through 8 that are respectively open at the top and that are individually led outside by connection lines (schematically shown as a conductor bundle 10), so that an arbitrary connection of the individual windings 1 through 8 to winding packets and sub-groups is possible outside of the coil.

Figure 2:
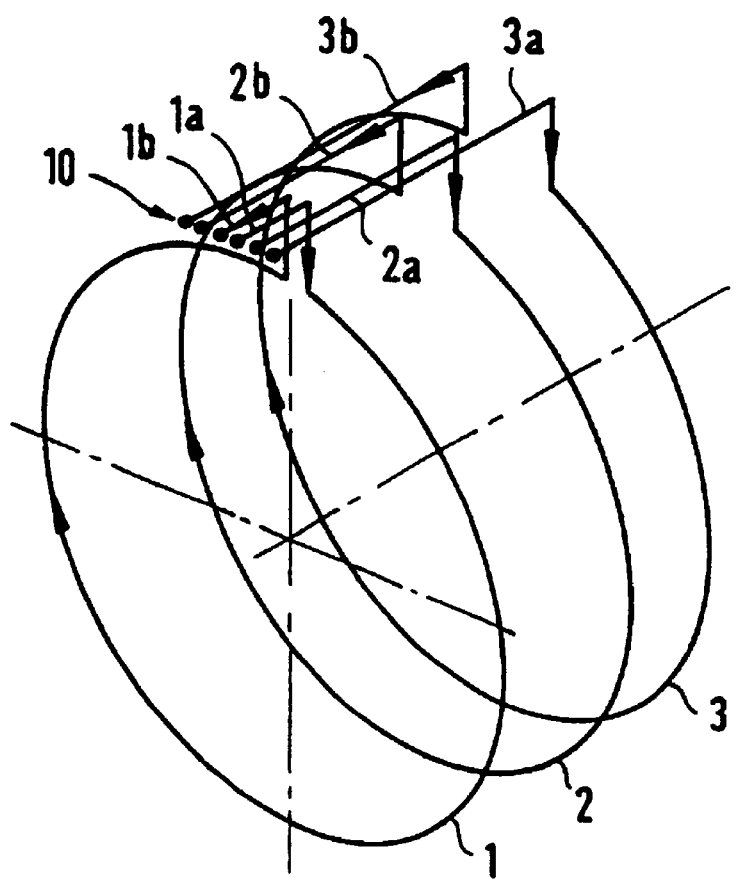
FIG. 2 is a detailed illustration of the frontmost three windings of the coil according to FIG. 1 with supply lines that are individually shown.

In FIG. 2, the detailed fashioning of the arrangement of the supply lines 1a, 1b, 2a, 2b and 3a, 3b can be seen on the basis of the first three windings 1 through 3. These individual lines form the conductor bundle 10, which is all that is shown in the other figures for simplifying the illustration and for better clarity. A number of single conductors, which respectively actuate the ends of the different discrete windings, are contained in a conductor bundle 10.

Figure 3:
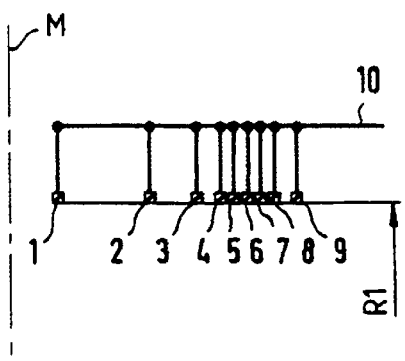
FIG. 3 and 4 is schematic longitudinal section through an arrangement similar to that of FIG. 1 with a different connecting of the windings among each other.
Figure 4:
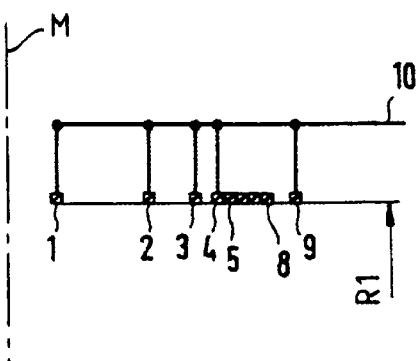

FIG. 3 shows a section through an inventively switchable Z-gradient coil, wherein nine windings all of the same radius R1 are provided, with the windings 1, 2, 3 and 9 being significantly spaced from one another, whereas the windings 4 through 8 are extremely close to one another and therefore represent a form of winding packet. All nine windings can be separately actuated and can be correspondingly differently connected with one another as a result. FIG. 4 schematically shows a connection, wherein the neighboring windings 4 through 8 are combined, so that they are therefore always traversed by the same current.

FIGS. 3 and 4 respectively show only one half of the entire switchable Z-gradient coil. The same winding configuration is present but not shown, symmetrical to the center plane M, mirrored to the left.

Figure 5:
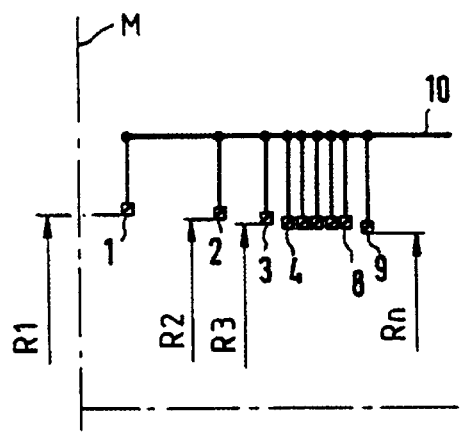
FIG. 5 is section through a half of an inventive switchable Z-gradient coil, wherein the individual windings or winding packets exhibit different diameters.

Given the partially illustrated half-coil of a switchable Z-gradient coil according to FIG. 5, the individual windings exhibit different radii R1, R2, R3 . . . Rn.

Figure 6:
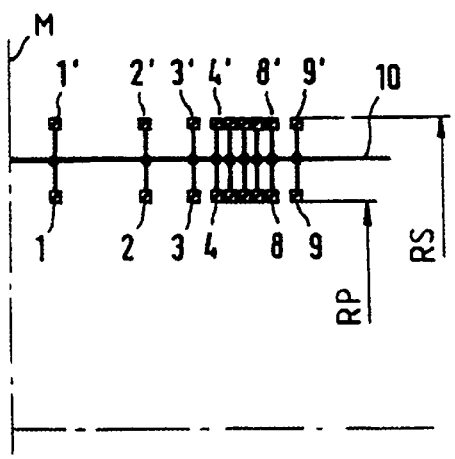
FIG. 6 shows one-half of an inventive switchable Z-coil Having an inner unit (primary coil) and an outer unit (secondary coil) with identical radii of the windings of the inner unit and the outer unit.

This is also true for the Z-gradient coil, one half of which is shown in FIG. 6. The windings 1 through 9 form an inner unit, namely a primary coil, for example, and the windings 1' through 9' with the larger radius RS form an outer unit, a secondary coil, for example, for a shielded Z-gradient coil arrangement, for example.

Figure 7:
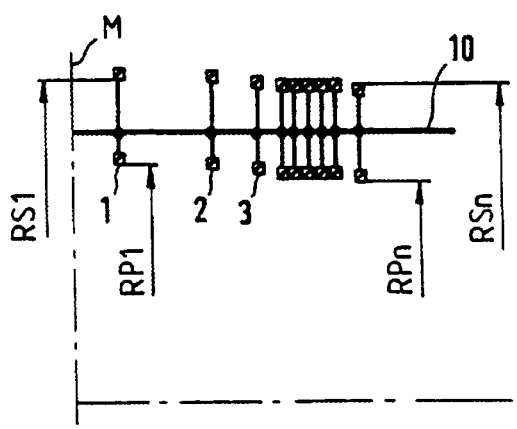
FIG. 7 shows a modified embodiment of a sub-coil having two radially displaced units according to FIG. 6, with the windings and winding packets of these units exhibiting different radii.
Figure 8:
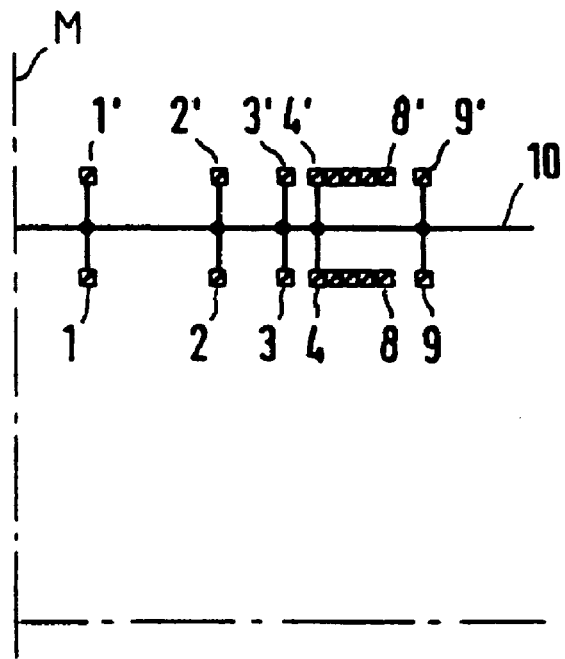
FIG. 8 shows a section that corresponds to FIG. 6, with a different connecting of the winding packets.

In the arrangement according to FIG. 7, the windings of the inner unit exhibit different radiuses RP1 through RPN relative to each other and the same is also true for the radii of the windings of the outer unit. Only the largest radius RS1 and smallest radius RSn are specifically designated here. The windings of the individual units can be respectively individually actuated in the FIGS. 6 and 7. In contrast thereto, FIG. 8 shows the case of the Z-coil according to FIG. 6, wherein the windings 4 through 8 and 4' through 8', are actuated as a packet.

Figure 9:
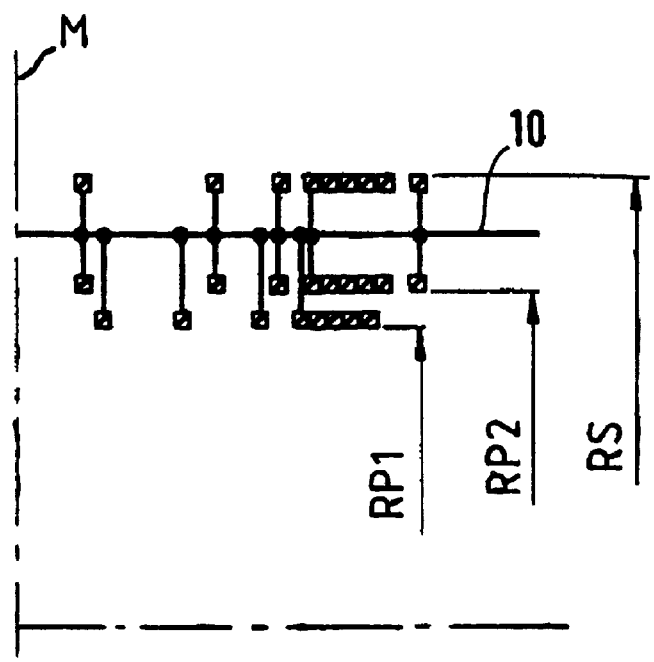
FIG. 9 shows a section through half of an inventively switchable Z-gradient coil with two inner units and one outer unit with partially connected winding packets.

FIG. 9 shows a half of a switchable Z-coil, wherein the windings of the inner units are divided among two radii RP1 and RP2 and the windings of the outer unit are all situated on the radius RS. This embodiment has two primary coils and one secondary coil. The conductor bundle 10 that is composed of the individual supply lines is only schematically indicated in these FIGS. 6 through 9.

Figure 10:
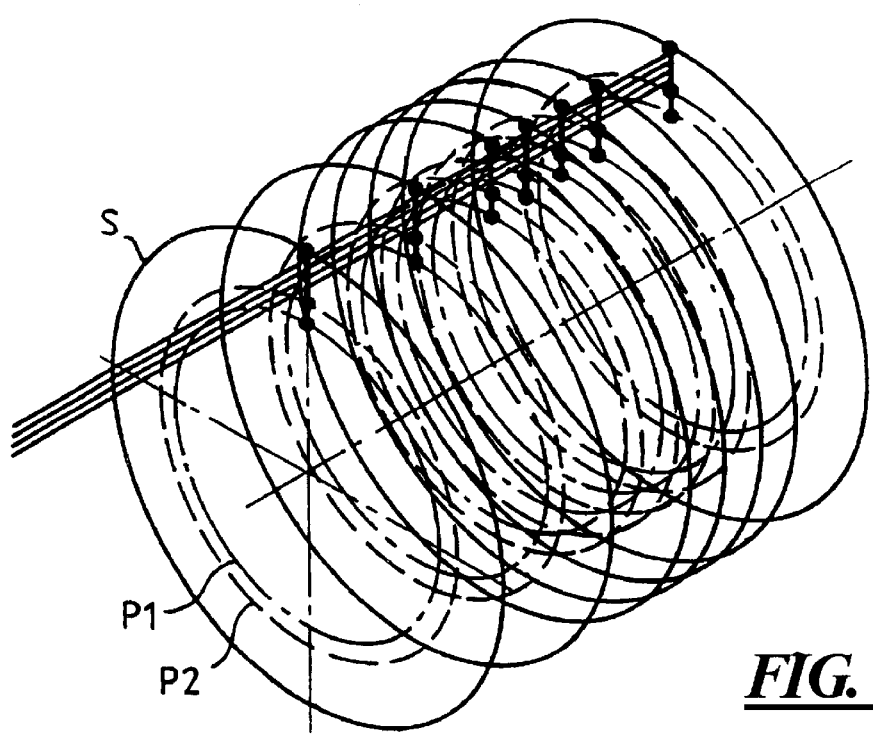
FIG. 10 is an illustration of the end face showing the connection of the windings.
Figure 11:
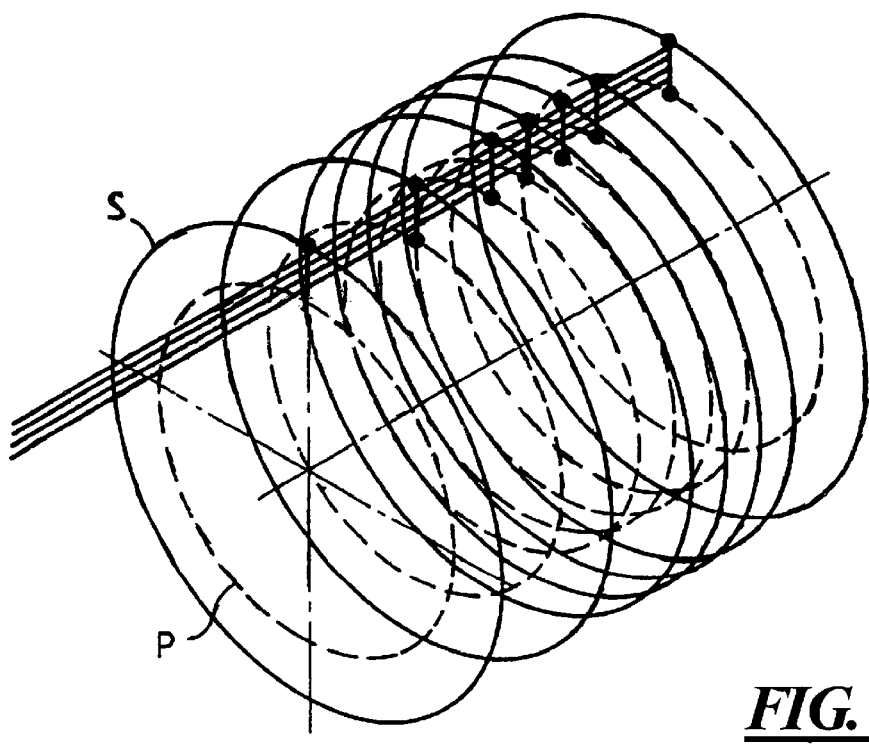
FIG. 11 is a perspective view of an inventive switchable Z-coil with an inner unit and an outer unit, in another embodiment.

In FIG. 10 the individual supply lines are again only schematically indicated and as the openings of the windings are not shown for simplification. FIG. 10 shows a switchable Z-gradient coil having two inner units, namely the primary coil P1 and the primary coil P2, and an outer unit, the secondary coils S. FIG. 11 shows a simpler embodiment of a switchable Z-gradient coil corresponding to the illustration according to FIG. 10 with only one primary coil P and one secondary coil S.

Figure 12:
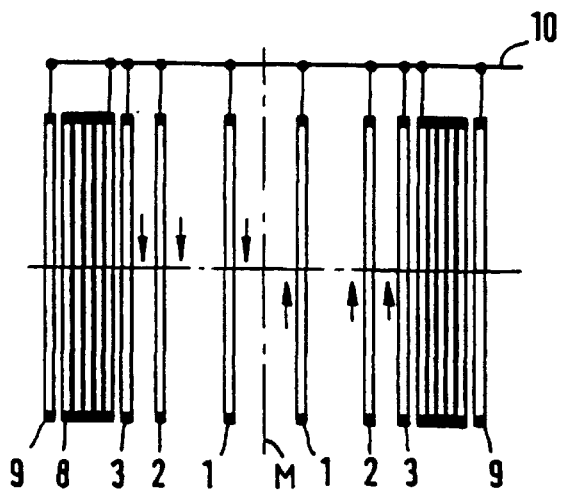
FIGS. 12 through 14 respectively show schematic side views of an inventive switchable Z-gradient coil in different switching states.
Figure 13:
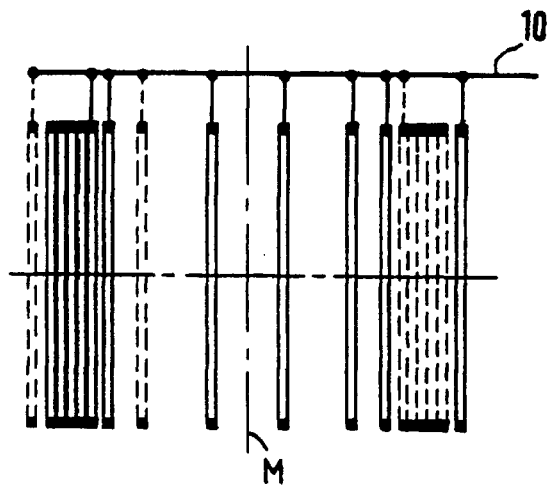
Figure 14:
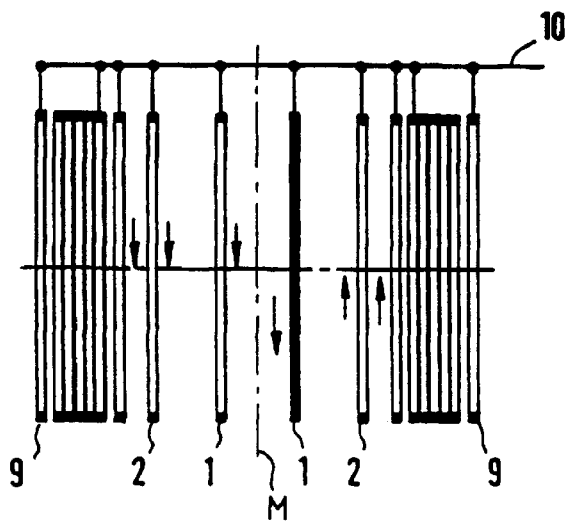

In a side view, the FIGS. 12 through 14 show a simple switchable Z-gradient coil, wherein all windings 1 through 9 of the right half and, mirror-symmetrically, also the winding of the left half of the Z-coil, exhibit the same diameter. FIG. 12 shows the standard current curve, wherein the windings of one coil half are traversed by current in one direction and the windings of the other coil half are traversed by current in the opposite direction. The windings 4 through 8 turn are connected in series as a packet and are not individually actuated in this embodiment. FIG. 13 shows an asymmetrical version wherein the windings and winding packets are partially switched off or disconnected (shown in broken lines) and FIG. 14 shows an asymmetrical connecting wherein, in the winding 1 of the right coil half, the current flows in a direction opposite to the normal current curve in the right coil half.

Although modifications and changes may be suggested by those skilled in the art, it is the intention of the inventors to embody within the patent warranted hereon all changes and modifications as reasonably and properly come within the scope of their contribution to the art.

We claim as our invention:

1. A switchable gradient coil for use in a magnetic resonance imaging apparatus, said gradient coil comprising:

a switchable longitudinal gradient coil for producing a Z-gradient field in an XYZ coordinate system, said longitudinal gradient coil having a plurality of windings forming a cylindrical structure having an end face and a longitudinal axis, said plurality windings being symmetrically arranged around said longitudinal axis;

said windings in said plurality being selected from the group consisting of discrete individual turns proceeding once around said cylindrical structure, packets of said discrete individual turns, continuous windings formed by multiple, fewer than said plurality, turns each proceeding once around said cylindrical structure, and packets of said continuous windings;

a plurality of separate supply lines respectively connected to said windings and proceeding from the respective windings to said end face of said cylindrical structure and terminating at said end face at respective supply line terminals of said longitudinal gradient coil; and said respective supply line terminals being selectively connectable to each other in connections selected from the group consisting of individual connections and group connections, to produce a selected performance feature of said windings, in combination.

2. A switchable longitudinal gradient coil as claimed in claim 1 wherein said windings are selectively connectable to reverse a current flow direction therein.

3. A switchable longitudinal gradient coil as claimed in claim 1 for use in producing a pulse sequence, and wherein said selective connections are statically fixed prior to said pulse sequence.

4. A switchable longitudinal gradient coil as claimed in claim 1 for use in producing a pulse sequence, and wherein said selective connections are dynamically changed during said pulse sequence.

5. A switchable longitudinal gradient coil as claimed in claim 1 wherein said windings have respectively different diameters relative to said longitudinal axis.

6. A switchable longitudinal gradient coil as claimed in claim 5 wherein said windings comprise a plurality of winding groups in respectively different radial planes relative to said longitudinal axis, said windings in each of said groups being connected together.

* * * * *